United States Patent [19]
Frey

[11] Patent Number: 5,920,078
[45] Date of Patent: Jul. 6, 1999

[54] OPTOELECTRONIC DEVICE USING INDIRECT-BANDGAP SEMICONDUCTOR MATERIAL

[76] Inventor: Jeffrey Frey, 5511 Center St., Chevy Chase, Md. 20815

[21] Appl. No.: 08/879,366

[22] Filed: Jun. 20, 1997

Related U.S. Application Data

[60] Provisional application No. 60/020,110, Jun. 20, 1996.

[51] Int. Cl.⁶ .................................................. H01L 29/06
[52] U.S. Cl. .............................. 257/14; 257/20; 257/21; 257/22; 257/24; 257/13
[58] Field of Search .................................. 257/14, 21, 22, 257/24, 94, 103, 13, 20

[56] References Cited

U.S. PATENT DOCUMENTS

| | | | |
|---|---|---|---|
| 3,279,964 | 10/1966 | Beck | 148/189 |
| 3,511,703 | 5/1970 | Peterson et al. | 117/213 |
| 3,667,989 | 6/1972 | Keating | 117/38 |
| 3,790,404 | 2/1974 | Garnache et al. | 117/106 |
| 4,227,291 | 10/1980 | Schumacher | 29/572 |
| 4,410,558 | 10/1983 | Izu et al. | 427/39 |
| 4,438,723 | 3/1984 | Cannella et al. | 118/718 |
| 4,478,880 | 10/1984 | Belouet | 427/86 |
| 4,485,125 | 11/1984 | Izu et al. | 427/74 |
| 4,664,939 | 5/1987 | Ovshinsky | 427/39 |
| 4,681,654 | 7/1987 | Clementi et al. | 156/630 |
| 4,684,964 | 8/1987 | Pankove et al. | 357/17 |
| 4,728,406 | 3/1988 | Banerjee et al. | 204/192.29 |
| 4,789,645 | 12/1988 | Calviello et al. | 437/51 |
| 4,884,112 | 11/1989 | Lorenzo et al. | 357/17 |
| 5,075,743 | 12/1991 | Behfar-Rad | 357/17 |
| 5,256,562 | 10/1993 | Vu et al. | 437/86 |
| 5,348,618 | 9/1994 | Canham et al. | 156/644 |
| 5,384,517 | 1/1995 | Uno | 315/169.3 |
| 5,510,633 | 4/1996 | Orlowski et al. | 257/93 |
| 5,607,876 | 3/1997 | Biegelsen et al. | 437/129 |
| 5,612,255 | 3/1997 | Chapple-Sokol et al. | 437/203 |
| 5,627,382 | 5/1997 | Canham et al. | 257/3 |
| 5,661,313 | 8/1997 | Dubbelday et al. | 257/103 |
| 5,689,603 | 11/1997 | Huth | 385/131 |

OTHER PUBLICATIONS

Brodsky, M.H., Silicon Light–Emitting Devices, *IBM Technical Disclosure Bulletin*, vol. 16, No. 3, Aug. 1973, p. 704.

Sundaram, K. B. et al., Photoluminescence studies of thermal impurity diffused porous silicon layers, 1997, pp. 163–169, *Journal of Materials Science: Materials in Electronics*, 8(1997).

Young, C.F. et al., Electron paramagnetic resonance of porous silicon: Observation and identification of conduction–band electrons, Jun. 1, 1997, pp. 7468–7470, *J. Appl. Phys.*, 81 (11).

Qin, G. G. et al., Photoluminescence mechanism for blue––light–emitting porous silicon, Aug. 15, 1997, pp. 12 876–12 879, *Physical Review B*, vol. 55, No. 19.

Allan, G. et al., Quantum confinement in the Si–III (BC–8) phase of porous silicon, May 5, 1997, pp. 2437–2439, *Appl. Phys. Lett.*, 70 (18).

Sen, S. et al., Spin–on doping of porous silicon and its effect on photoluminescence and transport characteristics, Apr. 28, 1997, pp. 2253–2255, *Appl. Phys. Lett.*, 70 (17).

(List continued on next page.)

*Primary Examiner*—Minh Loan Tran
*Attorney, Agent, or Firm*—Hunton & Williams

[57] ABSTRACT

This invention relates to the field of semiconductor devices. Silicon-based semiconductor devices ordinarily lack desirable optical properties because silicon's small, indirect band gap causes electrons to emit radiation with negligible quantum efficiency. This invention solves that problem by taking advantage of the change in the nature of the electron band gap when electron flow is confined within a one-dimensional channel known as a quantum wire. By biasing the junction between the quantum wire and the surrounding silicon support matrix with a voltage, a semiconductor device of this invention emits radiation of a variable and modulable wavelength, including visible light, as well as of a variable and modulable intensity. Alternatively, the workings of the device may be reversed such that it detects incoming radiation. Given its optical properties, such a device has numerous applications in the field of optoelectronics and integrated circuits.

12 Claims, 3 Drawing Sheets

OTHER PUBLICATIONS

Suemoto, T. et al., Comment on "Resonantly excited photoluminescence spectra of porous silicon", Apr. 15, 1997, pp. 10 115–10 118, *Physical Review B,* vol. 55, No. 15.

Valance, A., Theoretical model for early stages of porous silicon formation from n–and p–type silicon substrates, Apr. 15, 1997, pp. 9706–9715, *Physical Review B,* vol. 55, No. 15.

Laplaze, D. et al., The Use of Solar Energy for the Production of Fullerenes and Porous Silicon, Mar. 1997, pp. 463–472, *J. Phys. III France,* 7 (1997).

Lugo, J. E. et al., Influence of surface coverage on the effective optical properties of porous silicon modeled as a Si–wire array, Feb. 15, 1997, pp. 1923–1928, *J. Appl. Phys.,* 81 (4).

Salonen, J. et al., Thermal oxidation of free–standing porous silicon films, Feb. 3, 1997, pp. 637–639, *Appl. Phys. Lett.,* 70 (5).

Oguro, T. et al., Mechanism of the visible electroluminescence from metal/porous silicon/n–Si devices, Feb. 1, 1997, pp. 1407–1412, *J. Appl. Phys.,* 81 (3).

Hlávka, J., Photoeffect in porous silicon, Feb. 1, 1997, pp. 1404–1405, *J. Appl. Phys.,* 81 (3), Petit, D. et al., Porous silicon structure studied by nuclear magnetic resonance, Jan. 13, 1997, pp. 191–193, *Appl. Phys. Lett.,* 70 (2).

Collins, R. T. et al., Porous Silicon: From Luminescence to LEDs, Jan. 1997, pp. 24–31, *Physics Today.*

Wang, B. et al., Surface photovoltaic characterizations of porous silicon layers, 1997, pp. 40–44, *Thin Solid Films* 293.

Robert, C. et al., Elastic reflection of electrons by porous silicon layered (PSL) surfaces: effects of porosity, 1997, pp. 111–115, *Applied Surface Science* 115.

Nakamura, T. et al., Porous silicon annealed under mixed hydrogen and argon atmosphere, 1997, pp. 145–148, *Applied Surface Science* 113/114.

Matsumoto, T. et al., Coupling effect of surface vibration and quantum confinement carriers in porous silicon, 1997, pp. 140–144, *Applied Surface Science* 113/114.

Kleps, I. et al., Porous silicon field emitters for display applications, 1997, pp. 228–232, *Applied Surface Science* 111.

Gelloz, B., Possible explanation of the contradictory results on the porous silicon photoluminescence evolution after low temperature treatments, 1997, pp. 449–454, *Applied Surface Science* 108.

Leisenberger, F. et al., A high resolution XPS study of a complex insulator: the case of porous silicon, 1997, pp. 273–281, *Applied Surface Science* 108.

Chen, Y.–A. et al., Porous Silicon Light–Emitting Diode with Tunable Color, 1997, pp. 757–759, *Solid–State Electronics,* vol. 41, No. 5.

Winton, M. J. et al., Processing independent photoluminescence response of chemically etched porous silicon, Dec. 23, 1996, pp. 4026–4028, *Appl. Phys. Lett.,* 69 (26).

Kompan, M. E. et al., Observation of a compressed state of the quantum wire material in porous silicon by the method of Raman scattering, Nov. 25, 1996, pp. 748–753, *JETP Lett.,* vol. 64, No. 10.

Zhang, L. et al., Fabrication of a Porous Silicon Diode Possessing Distinct Red and Orange Electroluminescent Regions, Feb. 2, 1996, pp. L42–L44, *J. Electrochem. Soc.,* vol. 143, No. 2.

Sercel, P. C. et al., Visible electroluminescence from porous silicon/hydrogenated amorphous silicon pn–heterojunction devices, Jan. 29, 1996, pp. 684–686, *Appl. Phys. Lett.,* 68 (5).

Toyama, T. et al., Hot–electron–induced electroluminescence and avalanche multiplication in hydrogenated amorphous silicon, Jun. 15, 1995, pp. 6354–6357, *J. Appl. Phys.,* 77 (12).

Linnros, J. et al., High quantum efficiency for a porous silicon light emitting diode under pulsed operation, May 29, 1995, pp. 3048–3050, *Appl. Phys. Lett.,* 66 (22).

Saeta, P. N. et al., Visible luminescence from single crystal–silicon quantum wells, May 1, 1995, pp. 4639–4642, *J. Appl. Phys.,* 77 (9).

Lee, H.–J. et al., Light–emission phenomena from porous silicon: Siloxene compounds and quantum size effect, Jun. 15, 1994, pp. 8060–8065, *J. Appl. Phys.,* 75 (12).

Sabet–Dariani, R., Electroluminescence in porous silicon, Jun. 15, 1994, pp. 8008–8011, *J. Appl. Phys.,* 75 (12).

Wallich, P., Bright Future: Porous silicon proves versatile, but is it real?, Dec. 1993, pp. 22, 24, *Scientific American*.

Sanders, G. D. et al., Theory of transport in silicon quantum wires, Oct. 15, 1993, pp. 11 067–11 076, *Physical Review B,* vol. 48, No. 15.

Xia, J.–B., Theory of the electronic structure of porous Si, Aug. 15, 1993, pp. 5179–5186, *Physical Review B,* vol. 48, No. 8.

Hybertsen, M. et al., First–principles analysis of electronic states in silicon nanoscale quantum wires, Aug. 15, 1993, pp. 4608–4611, *Physical Review B,* vol. 48, No. 7.

Canham, L., A glowing future for silicon, Apr. 10, 1993, pp. 23–27, *New Scientist.*

Iyer, S. S. et al., Light Emission from Silicon, Apr. 2, 1993, pp. 40–46, *Science,* vol. 260.

Ohno, T. et al., Intrinsic Origin of Visible Light Emission from Silicon Quantum Wires: Electronic Structure and Geometrically Restricted Exciton, Oct. 19, 1992, pp. 2400–2403, *Physical Review Letters,* vol. 69, No. 16.

Buda, F. et al., Optical Properties of Porous Silicon: A First–Principles Study, Aug. 24, 1992, pp. 1272–1275, *Physical Review Letters,* vol. 69, No. 8.

Read, A. J. et al., First–Principles Calculations of the Electronic Properties of Silicon Quantum Wires, Aug. 24, 1992, pp. 1232–1235, *Physical Review Letters,* vol. 69, No. 8.

Doan, V. et al., Luminescent Color Image Generation on Porous Silicon, Jun. 26, 1992, pp. 1791–1792, *Science,* vol. 256.

Ren, S. et al., Hydrogenated Si clusters: Band formation with increasing size, Mar. 15, 1992, pp. 6492–6495, *Physical Review B,* vol. 45, No. 12.

Venkatasubramanian, R. et al., Visible light emission from quantized planar Ge structures, Sep. 23, 1991, pp. 1603–1605, *Appl. Phys. Lett.,* 59 (13).

Canham, L. T., Silicon quantum wire array fabrication by electrochemical and chemical dissolution of wafers, Sep. 3, 1990, pp. 1046–1048, *Appl. Phys. Lett.,* 57 (10).

Tachibana, H. et al., Exciton States of Polysilanes as Investigated by Electro–Absorption Spectra, 1990, pp. 5–9, *Solid State Communications,* vol. 75, No. 1.

Reed, M. A. et al., Observation of Discrete Electronic States in a Zero–Dimensional Semiconductor Nanostructure, Feb. 8, 1988, pp. 535–537, *Physical Review Letters,* vol. 60, No. 6.

Pearsall, T. P. et al., Structurally Induced Optical Transitions in Ge–Si Superlattices, Feb. 16, 1987, pp. 729–732, *Physical Review Letters,* vol. 58, No. 7.

DiMaria, D.J. et al., Electroluminescence studies in silicon dioxide films containing any silicon islands, Jul. 15, 1984, pp. 401–415, *J. Appl. Phys.,* 56 (2).

Gnutzmann, U. et al., Theory of Direct Optical Transitions in an Optical Indirect Semiconductor with a Superlattice Structure, 1974, pp. 9–14, *Appl. Phys.* 3.

Jang, Won I. et al., "Pressure control in a high vacuum multichamber system," *Solid State Technology,* Jan. 1997, pp. 67–68, 71–72, 74, 76.

DeJule, Ruth, "E–Beam Lithography: The Debate Comtinues," *Semiconductor International,* Sep. 1996, pp. 85–86, 88, 90, 92.

Dance, Brian, "Etch Technique Achieves Rapid Prototyping," *Semiconductor International,* Sep. 1996, p. 60.

"Silicon Dioxide Deposited at Low Temperature," *Semiconductor International,* Sep. 1996, p. 28.

VanLeeuwen, C., "Implications of 300 mm for Fab Design and Automation," *Semiconductor International,* Apr. 1996, pp. 91–92, 94, 96.

Lee, C. et al., "Next Generation Challenges to Thermal Processing," *Semiconductor International,* Mar. 1996, pp. 73–74, 76, 78.

Dance, Brian, "French Conference Presents Ultrafine Fabrication Advances," *Semiconductor International,* Feb. 1996, p. 62.

Dax, Mark, "Can Wafers be Cleaned Without Chemicals?," *Semiconductor International,* Feb. 1996, p. 50.

Lu, Z.H. et al., "Quantum confinement and light emission into $SiO_2$/Si superlattices," *Nature,* Nov. 16, 1995, pp, 258–260.

Chinnock, C., "Color to Go," *Byte,* Jun. 1995, pp. 115–116, 118, 122, 124, 126.

Takagi, H. et al., "Quantum size effects on photoluminescence in ultrafine Si particles," *Appl. Phys. Lett.,* 56 (24) Jun. 11, 1990, pp. 2379–2380.

Inoue, M., "Cathodoluminescence efficiency of binary compound phosphors," *J. Appl. Phys.,* 55 (6), Mar. 15, 1984, pp. 1558–1565.

OPTOELECTRONIC DEVICE USING INDIRECT-BANDGAP SEMICONDUCTOR MATERIAL

This application claims the benefit of U.S. Provisional Application No. 60/020,110, filed Jun. 20, 1996.

TECHNICAL FIELD

This invention relates generally to the field of semiconductor devices. More particularly, this invention relates to silicon-based semiconductor devices having optical properties that make them suitable for applications in the field of optoelectronics.

BACKGROUND ART

In free space, electrons can move in any of three dimensions, based on the influence of electric and/or magnetic fields. Techniques of constructing semiconductor devices, which are well-known to one skilled in the semiconductor fabrication arts, can be used to control the flow of electrons so that their movement is confined to two dimensions, i.e., in a plane, or one dimension, i.e., along a line. These techniques include, e.g., heteroepitaxial materials growth (for 2-dimensional confinement), or growth and etching for one-dimensional confinement.

When electrons in the conduction band of silicon recombine with holes in the valence band, they lose energy, which may be given off as radiation. This process, however, is so inefficient that silicon cannot usefully be employed for radiative emission. The problem stems from silicon's indirect band gap, which requires the energy produced in the recombination process to be dissipated in ways other than radiation. Thus, any emission from normal silicon has negligible quantum efficiency. Silicon's observed unsuitability as a material for optical applications is a technological drawback since most other electronic functions can be performed using well-developed silicon technology. Thus, silicon would certainly be a material of choice if optical components designed for large-scale optoelectronic integration, e.g., in optical fiber communications systems, are to be made at reasonable cost.

Fortunately, quantum theory teaches that electrons which are constrained within a space comparable in size to the atomic dimensions of the material can lose energy and emit radiation in a process that is efficient enough to be useful. Such "quantum confinement" changes the band gap so that it becomes direct, i.e., all of the energy given off in recombination is available for radiation. The wavelength of the resulting energy emissions depends on the actual size of the confining space, and may be in the visible region of the electromagnetic spectrum.

The wavelength of the emitted radiation will vary in accordance with the cross-section of the one-dimensional channel in which the electron flow is confined. For example, it has been observed that the energy and wavelength of emitted radiation can be tuned by changing the thickness of very thin layers of silicon films sandwiched between silicon dioxide insulating layers. When electron waves are confined to a thin film, they are restricted to an integer number of oscillations within the film. As the film gets thinner, the corresponding wavelength becomes shorter, and electrons oscillate at higher energy levels as they move from the valence band to the conduction band, thus affecting the wavelength of energy emitted during recombination.

DISCLOSURE OF INVENTION

This invention solves the problem of silicon not being an efficient and useful light emitter, and improves its efficiency as a detector, by applying the quantum mechanical principles described above to the design, construction and operation of a silicon-based semiconductor device. It confines the flow of electrons within one or more one-dimensional channels, known as "quantum wires." The quantum wires are constructed by changing the conductivity type of a silicon support matrix from p-type to n-type, or inversely.

Conventional fabrication processes—e.g., standard photolithographic and doping processes, including focused ion beam doping—will yield silicon "quantum wires" of a predetermined physical cross-sectional width. The quantum wires can have an effective electrical cross-section, however, that is narrower than the physical width achieved by fabrication techniques. Biasing the p-n junction between the quantum wires and the support matrix with a voltage of the proper sign creates a depletion region inside each of the wires from which electronics are excluded, and thus limits the effective electrical cross-section. Because the extent of the depletion region depends on the bias voltage, the effective electrical cross-section can be controlled by varying the bias voltage. Since the wavelength of the light emission depends on the effective electrical cross-section, the wavelength will depend on the bias voltage.

In an optical detector, electrons are radiatively excited from the valence to the conduction band. When the device of this invention is used as a detector, the wavelength of radiation to which the device is most sensitive can be adjusted by the same bias voltage which adjusts the emitted radiation wavelength when the device is used as an emitter. In addition, conversion to a direct band gap results in similar increases in quantum efficiency. Thus, in an analogous manner, the wavelength of maximum sensitivity as a detector also depends on the bias voltage.

By harnessing the behavior of electrons subjected to quantum confinement within a biased structure, this invention creates an electrically tunable light-emitting and/or radiation-emitting semiconductor device. Moreover, the device's operation can be usefully reversed so that it operates as a detector of incoming radiation, as well as an emitter, by converting the absorbed energy into measurable voltage.

This invention has several advantages over the prior art. First, a semiconductor device constructed in accordance with this invention will constrain electron flow to one dimension so that the radiation emitted by electrons in silicon is efficient enough to be used in a variety of optoelectronic applications. Second, a semiconductor device of this invention will emit radiation of variable and tunable wavelength and intensity by changing the corresponding voltages. Such a device will also detect, using the same quantum principles, incoming radiation of a given wavelength and intensity by translating the electron absorption into measurable voltages. Finally, a semiconductor device of this invention can be constructed at relatively low cost, using conventional fabrication techniques as well as new techniques discovered by the applicant.

These and other advantages of the invention will be apparent from the drawings and the best mode disclosure and the industrial applicability sections that follow.

BEST MODE FOR CARRYING OUT THE INVENTION

Figure 1:
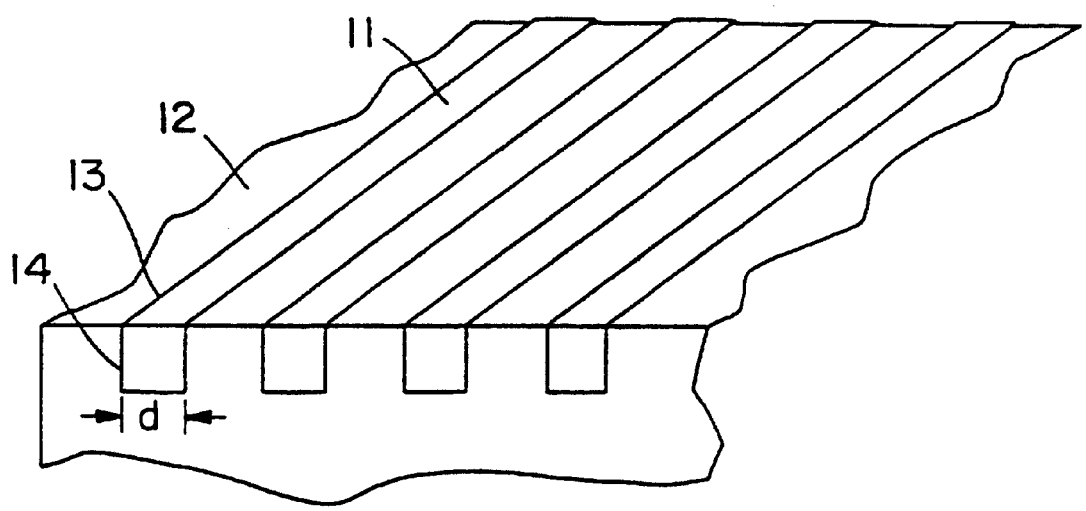
FIG. 1 is a diagram explaining the basic geometry of silicon quantum wires.

Turning first to FIG. 1, a semiconductor device of this invention (10) (shown in FIGS. 3, 4 and 5) has one or more one-dimensional channels for electron flow known as quantum wires (11). The single dimension of interest is that along which electrons can flow under the influence of an electric field. As shown in this diagram, the silicon quantum wires (11) are fabricated by changing the conductivity type of a silicon support matrix (12) from p-type to n-type. In other words, each wire (11) is defined by a region having the desired quantum dimensions, in which the conductivity type is different from that of the support matrix (12). As fabricated, the wires (11) will have a predetermined physical cross-sectional width of a value d.

The change in the conductivity type means each wire (11) defined by a p-n junction (13) between the wire (11) and support matrix (12). This junction (13) can be back-biased to form a depletion region (14) inside the wire (11). The extent of the depletion region (14), which depends on the bias voltage, effectively limits the electrical cross-section of the wire (11) to some predetermined value d' that is less than the physical cross-section d.

Figure 2:
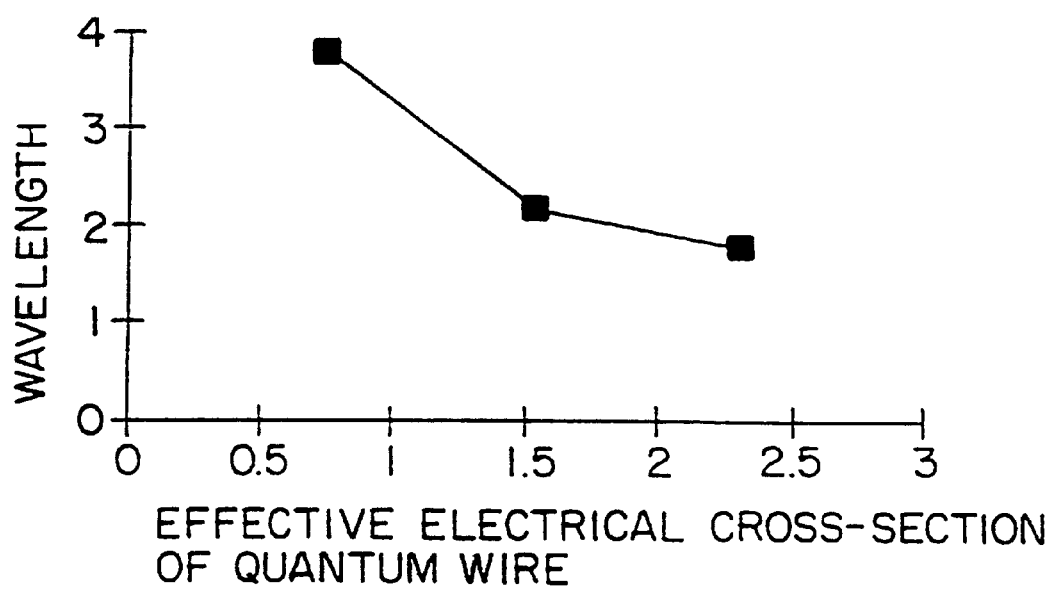
FIG. 2 is a graph showing the relationship between the wavelength of emitted radiation and the quantum wire side length (width).

FIG. 2 illustrates the dependent relationship between the wavelength of the emitted radiation (y axis), expressed in electron volts, with a direct band gap having a value k=0, and the effective electrical cross-section of the quantum wire (x axis), expressed in nanometers. As the electrical cross-section decreases, the wavelength of the emitted radiation shortens. The wavelength can be modulated by merely adjusting the reverse bias voltage between the quantum wire (11) and the support matrix (12).

Figure 3:
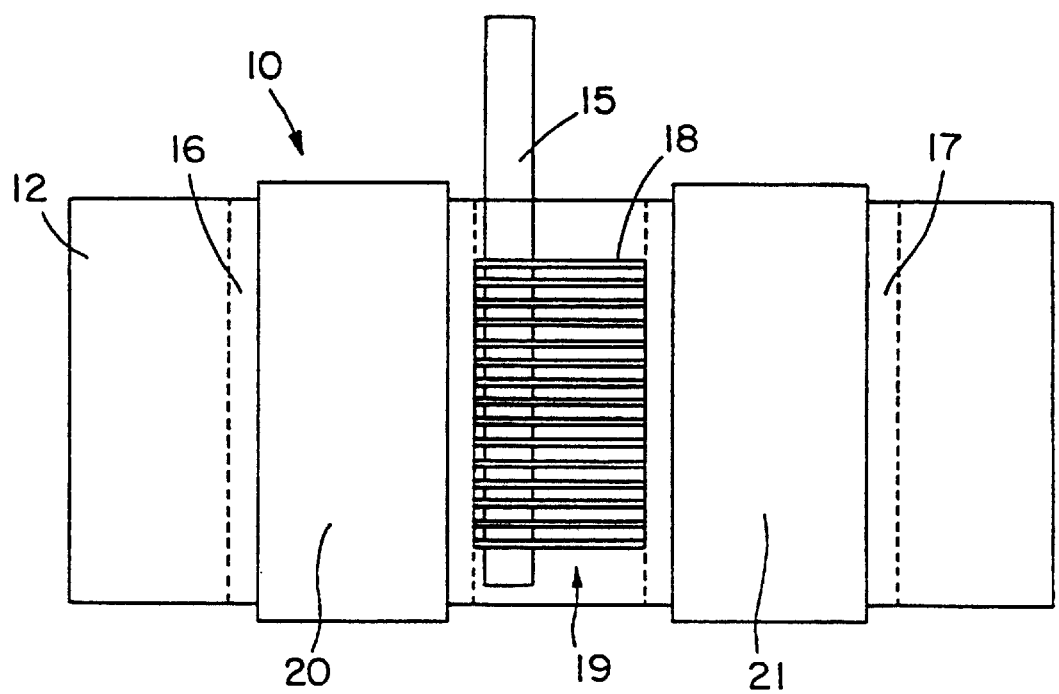
FIG. 3 is a top plan view of a preferred embodiment of a light-emitting semiconductor device of this invention.
Figure 4:
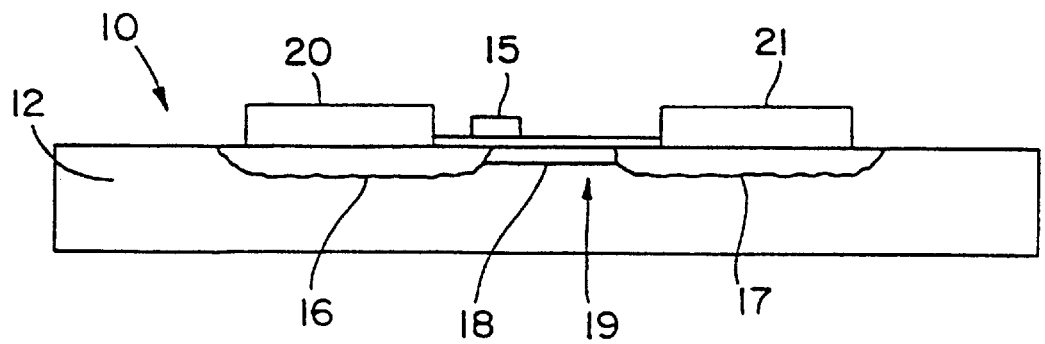
FIG. 4 is a side cross-sectional view of a preferred embodiment of a light-emitting semiconductor device of this invention.

FIGS. 3 and 4 illustrate one possible embodiment of a semiconductor device of this invention (10). As seen from above in FIG. 3, the device (10) is similar in configuration to a standard MOSFET with a control gate. Here, however, the control gate (15) is narrower, expressed as a fraction of the distance from source (16) to drain (17), than that in a standard MOSFET. Although not shown in any of the figures, the control gate (15) alternatively may have a width that approximates the distance between the source (16) and the drain (17), as long as it is thin enough to allow emitted radiation to pass through it. The device (10) also has an array of parallel silicon quantum wires (18) in the source-drain region (19) instead of the characteristic uniformly doped channel. Overlying the source (16) and the drain (17) are the source contact (20) and the drain contact (21). These latter structures can be seen more clearly in the cross-sectional view of FIG. 4.

Figure 5:
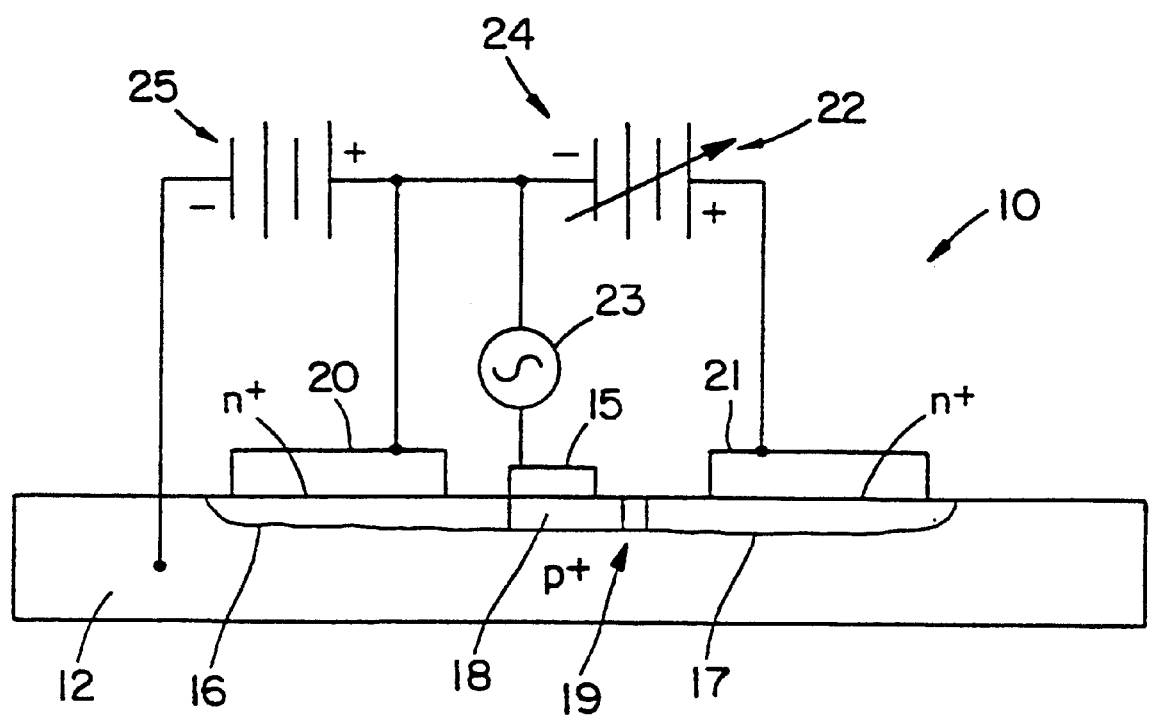
FIG. 5 is a side cross-sectional view of a preferred embodiment of a light-emitting semiconductor device of this invention, on which an electrical diagram has been superimposed to show the bias voltages for modulating intensity and wavelength, respectively.

As shown in FIG. 5, a DC voltage between the support matrix (12) and the source (16) or the drain (17) modulates the wavelength of the emitted radiation, or that of maximum sensitivity for detected radiation, as represented by an arrow (22). The voltage on the control gate (15) relative to that on the source (16) adjusts, as in a standard MOSFET, the amount of current flowing to the drain (17), and therefore the intensity of the emitted radiation when the device is used as an emitter, as represented by a symbol (23). Two separate bias voltages (24) and (25) thus modulate the intensity and wavelength of the emitted radiation.

The device is preferably made of silicon but other semiconductor materials may be used. It may be made by conventional techniques as well as by techniques and processes disclosed in applicant's U.S. Pat. No. 5, 563,095, issued Oct. 8, 1996, for a "Method for Manufacturing Semiconductor Devices." The device's fabrication is simple; it may require only one sequence of lithography/doping steps beyond that required for the production of a standard MOSFET.

INDUSTRIAL APPLICABILITY

Numerous applications for a semiconductor device of this invention, using quantum wires either singly or in arrays, can be conceived by one skilled in the semiconductor device art. For example, such devices may easily be arranged into arrays to produce color, flat-panel displays of high efficiency. These displays would not need back lighting, would operate using voltages within the ranges commonly used in logic circuits today, and could be monolithically integrated with such circuits. Alternatively, narrow bandwidth silicon detectors with the wavelength of peak sensitivity tuned by a bias voltage or voltages could be constructed in accordance with this invention.

I claim:

1. A semiconductor device having optical properties of radiation emission and radiation detection, the device being characterized by the fabrication of one or more quantum wires that confine the flow of electrons to a single dimension so that electrons in a valence band absorb energy by efficient excitation into a conduction band and electrons in a conduction band release energy by efficient recombination into a valence band.

2. The device of claim 1, the device being characterized by the fabrication of one or more quantum wires that confine the flow of electrons to a single dimension so that electrons in a valence band absorb energy by efficient excitation into a conduction band and electrons in a conduction band radiatively release energy by efficient recombination into a valence band.

3. The device of claim 1, the device being characterized by its manufacture from silicon and the manufacture of one or more silicon quantum wires by changing the conductivity type of a silicon support matrix from p-type to n-type.

4. The device of claim 1, the device being characterized by its manufacture from silicon and the manufacture of one or more silicon quantum wires by changing the conductivity type of a silicon support matrix from n-type to p-type.

5. The device of claim 3 or 4, the device being characterized by the incorporation of a means of creating a bias voltage between the silicon support matrix and the silicon quantum wire so that a depletion region is formed inside the wire which narrows the effective cross-section of the wire for electron flow.

6. The device of claim 3 or 4, the device being characterized by the incorporation of an adjustable means of creating a predetermined bias voltage between the silicon support matrix and the silicon quantum wire so that a depletion region is formed inside the wire which narrows the effective cross-section of the wire for electron flow by a predetermined value.

7. A silicon-based light-emitting semiconductor device having a configuration similar to that of a standard MOSFET, including a control gate, a source, a drain, a region of a silicon support matrix between the source and the drain, and contacts for the source and the drain, the device being characterized by a control gate that is so constructed as to permit radiation emission in a direction away from the surface of the device, and a plurality of parallel silicon quantum wires set in an array in the region.

8. A silicon-based semiconductor device having a configuration similar to that of a standard MOSFET, including a control gate, a source, a drain, a region of a silicon support matrix between the source and the drain, and contacts for the source and the drain, the device being characterized by a control gate that is thin enough to permit emitted radiation to pass through it, and a plurality of parallel silicon quantum wires set in an array in a source-drain region instead of the uniformly doped channel that is characteristic of a standard MOSFET.

9. The device of claim 7 or 8, the device being characterized by the incorporation of an adjustable means of creating a predetermined bias voltage running between the silicon support matrix and either the source or the drain so that radiation of a predetermined wavelength can be emitted by adjusting the bias voltage.

10. The device of claim 7 or 8, the device being characterized by the incorporation of an adjustable means of creating a predetermined bias voltage running between the control gate and the source so that radiation of a predetermined intensity can be emitted by adjusting the bias voltage.

11. The device of claim 7 or 8, the device being characterized by a separate adjustable means for adjusting the bias voltage between the silicon support matrix and the source or the drain and a separate adjustable means for adjusting the bias voltage between the control gate and the source.

12. The device of claim 7 or 8, the device being characterized by the incorporation of a detecting means to measure a change in the bias voltage running between the silicon support matrix and the source or the drain that results when incoming radiation is absorbed by electrons in the quantum wire array, and to determine the wavelength of the incoming radiation based on the change in the bias voltage.

* * * * *